United States Patent
Achuthan et al.

(10) Patent No.: US 7,449,413 B1
(45) Date of Patent: Nov. 11, 2008

(54) METHOD FOR EFFECTIVELY REMOVING POLYSILICON NODULE DEFECTS

(75) Inventors: Krishnashree Achuthan, San Ramon, CA (US); Kashmir Sahota, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 310 days.

(21) Appl. No.: 11/402,082

(22) Filed: Apr. 11, 2006

(51) Int. Cl.
*H01L 21/302* (2006.01)
*H01L 21/461* (2006.01)
*B24B 1/00* (2006.01)
*B24C 1/00* (2006.01)

(52) U.S. Cl. .................. 438/692; 438/693; 451/57; 451/37; 451/41

(58) Field of Classification Search .......... 438/692; 451/57, 59, 37, 41, 28, 29
See application file for complete search history.

(56) References Cited

U.S. PATENT DOCUMENTS 7,077,728 B1 * 7/2006 Achuthan et al. ............ 451/41
2006/0024932 A1 * 2/2006 Park et al. .................. 438/530

* cited by examiner

*Primary Examiner*—Walter L Lindsay, Jr.
(74) *Attorney, Agent, or Firm*—Farjami & Farjami LLP

(57) ABSTRACT

According to one exemplary embodiment, a method includes a step of forming a polysilicon layer over a substrate by using a deposition process, where the deposition process causes polysilicon nodule defects to form on a top surface of the polysilicon layer. The method further includes performing a polysilicon CMP process on the polysilicon layer, where the polysilicon CMP process removes a substantial percentage of the polysilicon nodule defects from the top surface of the polysilicon layer. The CMP process removes at least 95.0 percent of the polysilicon nodule defects from the top surface of the polysilicon layer. According to this embodiment, the polysilicon CMP process utilizes a polishing pressure that is less than 1.5 psi. The polysilicon CMP process also utilizes a table speed of between 20.0 rpm and 40.0 rpm. The polysilicon CMP process further utilizes a colloidal silica slurry.

10 Claims, 4 Drawing Sheets

METHOD FOR EFFECTIVELY REMOVING POLYSILICON NODULE DEFECTS

TECHNICAL FIELD

The present invention is generally in the field of fabrication of semiconductor devices. More specifically, the present invention is in the field of polysilicon processing in semiconductor device fabrication.

BACKGROUND ART

During formation of a polycrystalline silicon (polysilicon) layer, which can serve, for example, as a gate layer for a semiconductor device, polysilicon nodule defects can form on the polysilicon layer. The polysilicon nodule defects, which can be as large as the initial thickness of the polysilicon layer, can cause a significant undesirable effect on the integrity of the polysilicon layer. Also, the polysilicon nodule defects can cause unwanted bridging in semiconductor devices, which can be very difficult to remove in subsequent processing steps.

Polysilicon nodule defects can also form on an oxide layer after an overlying layer of polysilicon has been etched. For example, polysilicon nodule defects can form on sidewalls of oxide segments that are situated under a polysilicon layer after the polysilicon layer has been etched to form wordlines during memory device fabrication. Although over-etching the polysilicon layer may remove some of the polysilicon nodule defects, over-etching can also cause undesirable damage to underlying semiconductor device layers.

Thus, there is a need in the art for a method for effectively removing polysilicon nodule defects that are formed on a deposited layer of polysilicon or formed on an oxide segment after etching an overlying polysilicon layer.

SUMMARY

The present invention is directed to a method for effectively removing polysilicon nodule defects. The present invention addresses and resolves the need in the art for a method for effectively removing polysilicon nodule defects that are formed on a deposited layer of polysilicon or formed on an oxide segment after etching an overlying polysilicon layer.

According to one exemplary embodiment, a method includes a step of forming a polysilicon layer over a substrate by using a deposition process, where the deposition process causes polysilicon nodule defects to form on a top surface of the polysilicon layer. The polysilicon layer can be doped polysilicon, for example. The polysilicon nodule defects have a maximum height of approximately 1000.0 Angstroms, for example. The method further includes performing a polysilicon CMP process on the polysilicon layer, where the polysilicon CMP process removes a substantial percentage of the polysilicon nodule defects from the top surface of the polysilicon layer. The CMP process removes at least 95.0 percent of the polysilicon nodule defects from the top surface of the polysilicon layer.

According to this embodiment, the polysilicon CMP process utilizes a polishing pressure that is less than 1.5 psi. The polysilicon CMP process also utilizes a table speed of between 20.0 rpm and 40.0 rpm. The polysilicon CMP process further utilizes a colloidal silica slurry. The polysilicon CMP process can be performed for a duration equivalent to a length of time required by the polysilicon CMP process to remove between 150.0 Angstroms and 300.0 Angstroms of polysilicon from a layer of polysilicon situated on a polysilicon nodule defect free test wafer. The method further includes performing a wet etch process to remove metal contamination caused by the polysilicon CMP process. The wet etch process can include a mixture of hydrochloric acid, hydrogen peroxide, and water, for example.

In one embodiment, the invention is a method for removing polysilicon nodule defects from at least one oxide segment, where the polysilicon nodule defects form on the at least one oxide segment after an overlying polysilicon layer has been etched. Other features and advantages of the present invention will become more readily apparent to those of ordinary skill in the art after reviewing the following detailed description and accompanying drawings.

DETAILED DESCRIPTION OF THE INVENTION

Figure 1:
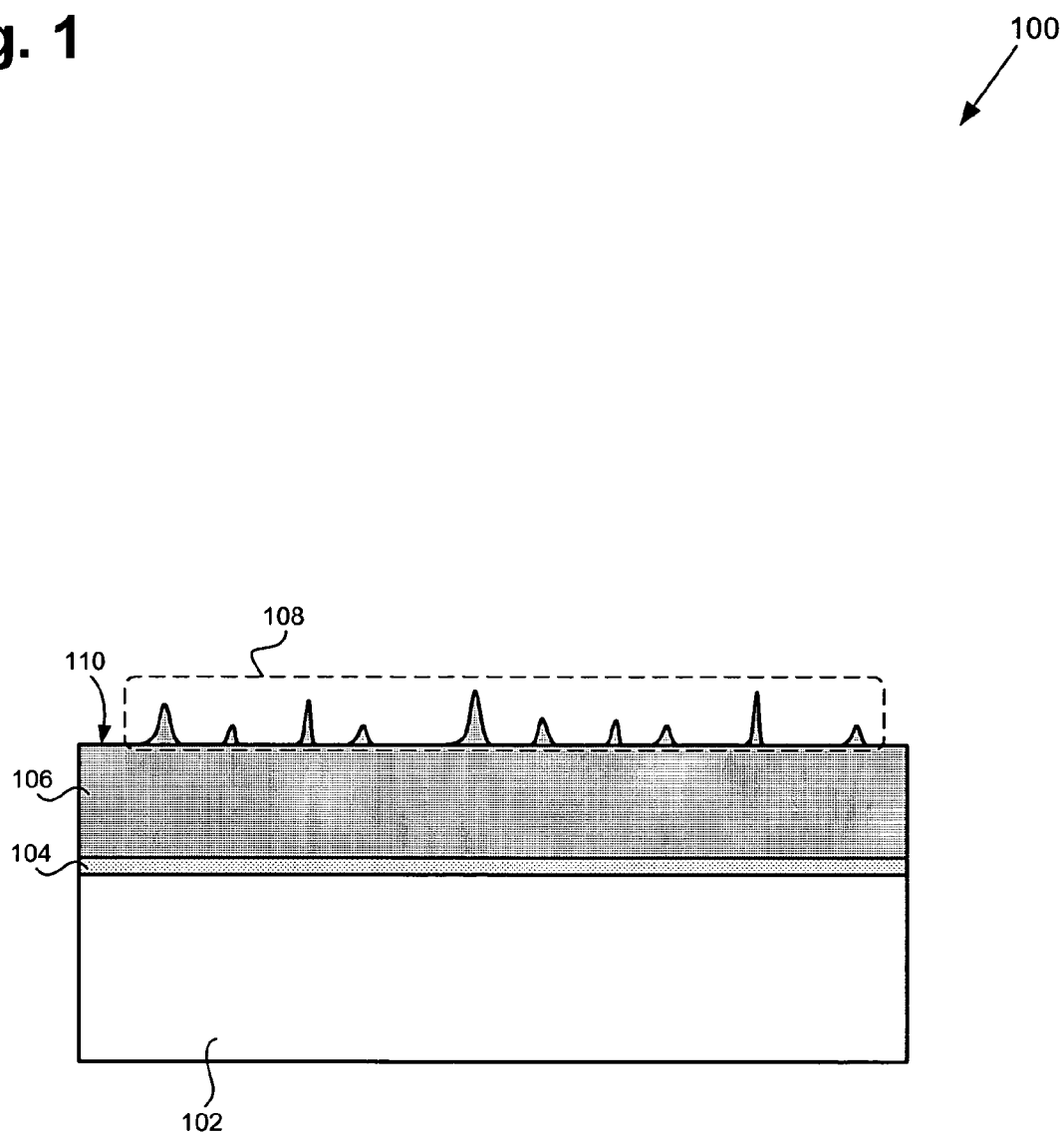
FIG. 1 illustrates a cross-section view of a structure including exemplary polysilicon nodules defects situated on an exemplary layer of polysilicon.

The present invention is directed to a method for effectively removing polysilicon nodule defects. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be borne in mind that, unless noted otherwise, like or corresponding elements among the figures may be indicated by like or corresponding reference numerals.

FIG. 1 shows a cross-sectional view of an exemplary structure including exemplary polysilicon nodule defects formed on an exemplary polysilicon layer. Structure 100 includes substrate 102, dielectric layer 104, polysilicon layer 106, and polysilicon nodule defects 108. Structure 100 can be an intermediate structure that results after formation of a polysilicon layer during fabrication of a semiconductor device, such as a semiconductor logic device or memory device.

As shown in FIG. 1, dielectric layer 104 is situated over substrate 102 and can comprise silicon oxide or other suitable dielectric material. Dielectric layer 104 can be a gate dielectric layer, for example. Dielectric layer 104 can be formed on substrate 102 by using a chemical vapor deposition (CVD) process or other suitable deposition processes. Also shown in FIG. 1, polysilicon layer 106 is situated on dielectric layer 104 and can comprise doped polysilicon (i.e. polysilicon that is doped with a suitable dopant) or undoped polysilicon. Polysilicon layer 106 can be a transistor gate layer, for example, and can be formed by using a low pressure chemical vapor deposition (LPCVD) or other suitable deposition processes to deposit a layer of polysilicon on dielectric layer 104. Polysilicon layer 106 can have a thickness of approximately 1000.0 Angstroms, for example.

Further shown in FIG. 1, polysilicon nodule defects 108 are situated on top surface 110 of polysilicon layer 106 and are formed during formation of polysilicon layer 106. Polysilicon nodule defects 108 can have a maximum height (as measured from the top surface of the polysilicon layer) of approximately 1000.0 Angstroms, for example. The present invention provides a polysilicon chemical mechanical polishing (CMP) process for effectively removing substantially all of polysilicon nodule defects (e.g. polysilicon nodule defects 108) that can form on a layer of polysilicon. For example, the invention's polysilicon CMP process can remove at least 95.0 percent of the polysilicon nodule defects (e.g. polysilicon nodule defects 108) that can form on a layer of polysilicon (e.g. polysilicon layer 106). In one embodiment, the invention's polysilicon CMP process can remove approximately 98.3 percent of polysilicon nodule defects (e.g. polysilicon nodule defects 108) that can form on a layer of polysilicon (e.g. polysilicon layer 106).

The invention's polysilicon CMP process can utilize a fine colloidal silica slurry, a polishing pressure that is less than approximately 1.5 pounds per square inch (psi), and a "table speed" of between 20.0 revolutions per minute (rpm) and 40.0 rpm to substantially remove the polysilicon nodule defects. The "table speed" refers to the rotational speed of the table on which structure 100 is mounted. The polysilicon CMP process is performed for a duration equivalent to the length of time required by the CMP process to remove between 150.0 Angstroms and 300.0 Angstroms of polysilicon from a blanket-deposited layer of polysilicon a test wafer, where the test wafer does not have polysilicon nodule defects. Since a precise end-point for removal of the polysilicon nodule defects is very difficult to detect, the invention's polysilicon CMP process must be performed at an appropriately slow speed and for an appropriately long duration so as to achieve a stable CMP process, which is required to effectively remove the polysilicon nodule defects. In order to maintain a stable CMP process, a hard, appropriately conditioned polishing pad is utilized. For example, the polishing pad can be conditioned by brushing a diamond wheel across the pad's surface. After the invention's CMP process has been performed, a wet etch process can be performed on the wafer to remove any metal contamination, which can include trace levels of potassium, calcium or other metals, caused by the CMP process. For example, the wet etch process can comprise a mixture of hydrochloric acid, hydrogen peroxide, and water, which is also referred to as "HPM," or other suitable wet etch process.

Thus, as discussed above, the invention's polysilicon CMP process can effectively remove polysilicon nodule defects formed on a top surface of a polysilicon layer, where the polysilicon nodule defects have a height of up to 1000.0 Angstroms. By removing polysilicon nodule defects from the deposited polysilicon layer, the invention's polysilicon CMP process significantly increases the integrity of the deposited polysilicon layer and, thereby, advantageously increases semiconductor device manufacturing yield.

Figure 2:
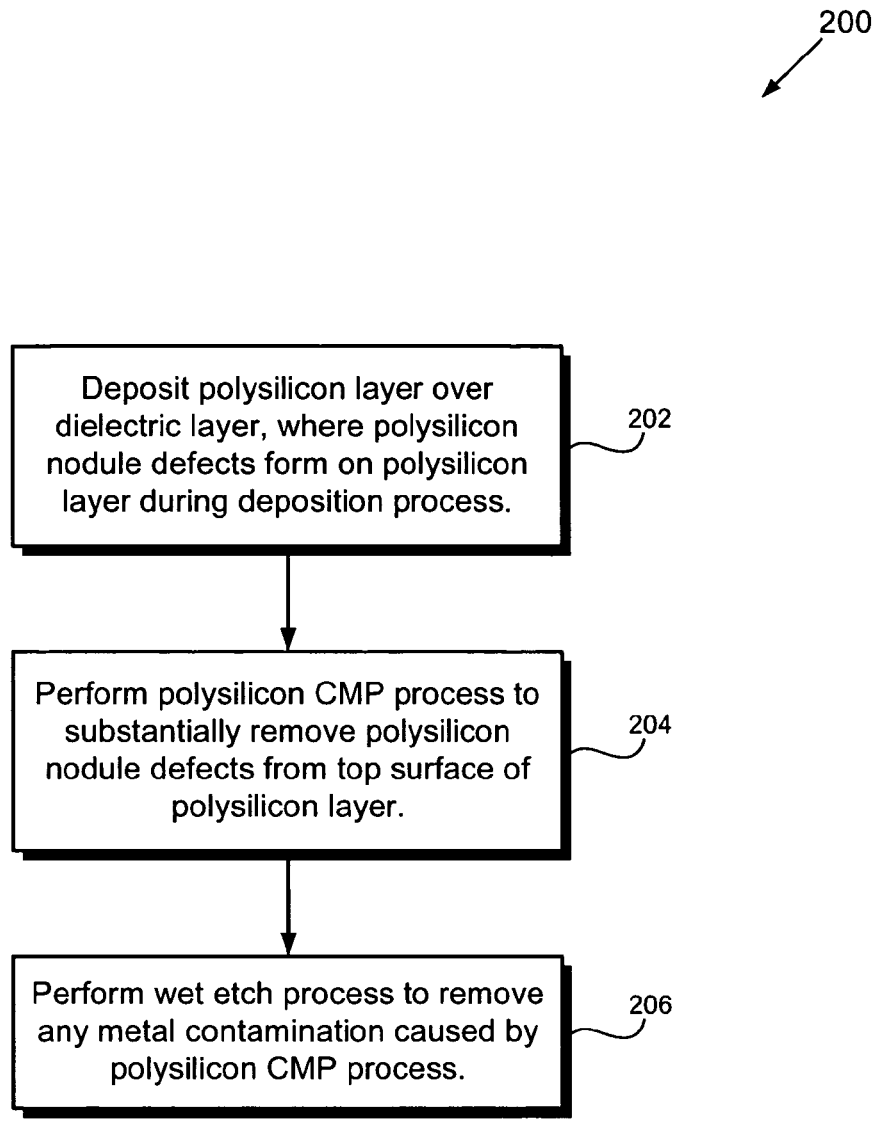
FIG. 2 shows a flowchart illustrating the steps taken to implement an embodiment of the present invention.

FIG. 2 shows a flowchart illustrating an exemplary method according to an embodiment of the present invention. Certain details and features have been left out of flowchart 200 that are apparent to a person of ordinary skill in the art. For example, a step may consist of one or more substeps or may involve specialized equipment or materials, as known in the art. Steps 202, 204, and 206 indicated in flowchart 200 are sufficient to describe one embodiment of the present invention; other embodiments of the invention may utilize steps different from those shown in flowchart 200.

Referring now to step 202 of flowchart 200 in FIG. 2, polysilicon layer 106 in FIG. 1 is deposited over dielectric layer 104, where polysilicon nodule defects 108 form on top surface 110 of polysilicon layer 106 during the deposition process. Polysilicon layer 106 can comprise doped or undoped polysilicon and can be deposited by an LPCVD process or other suitable deposition processes. Dielectric layer 104, which is situated on substrate 102, can comprise silicon oxide or other suitable dielectric material. At step of 204 of flowchart 200, the invention's polysilicon CMP process is performed to substantially remove polysilicon nodule defects 108 from top surface 110 of polysilicon layer 106. The polysilicon CMP process can remove at least 95.0 percent of polysilicon nodule defects 108, for example.

As discussed above, the invention's polysilicon CMP process can utilize a fine colloidal silicon slurry, less than approximately 1.5 psi of polishing pressure, and a table speed of between 20.0 rpm and 40.0 rpm. To effective remove polysilicon nodule defects having a height of up to 1000.0 Angstroms, the polysilicon CMP process can be performed for a duration equivalent to the time required to remove between 150.0 Angstroms and 300.0 Angstroms of blanket-deposited polysilicon from a polysilicon nodule defect free test wafer. The invention's polysilicon CMP is performed at an appropriately slow speed and for an appropriately long duration so as to achieve a stable polishing process, which is required to effectively remove the polysilicon nodule defects.

At step 206 of flowchart 200, a wet etch process is performed to remove any metal contamination on the wafer caused by the polysilicon CMP process. For example, the wet etch process comprise HPM (i.e. a mixture of hydrochloric acid, hydrogen peroxide, and water). The metal contamination caused by the polysilicon CMP process can include, for example, trace levels of potassium and calcium.

Figure 3:
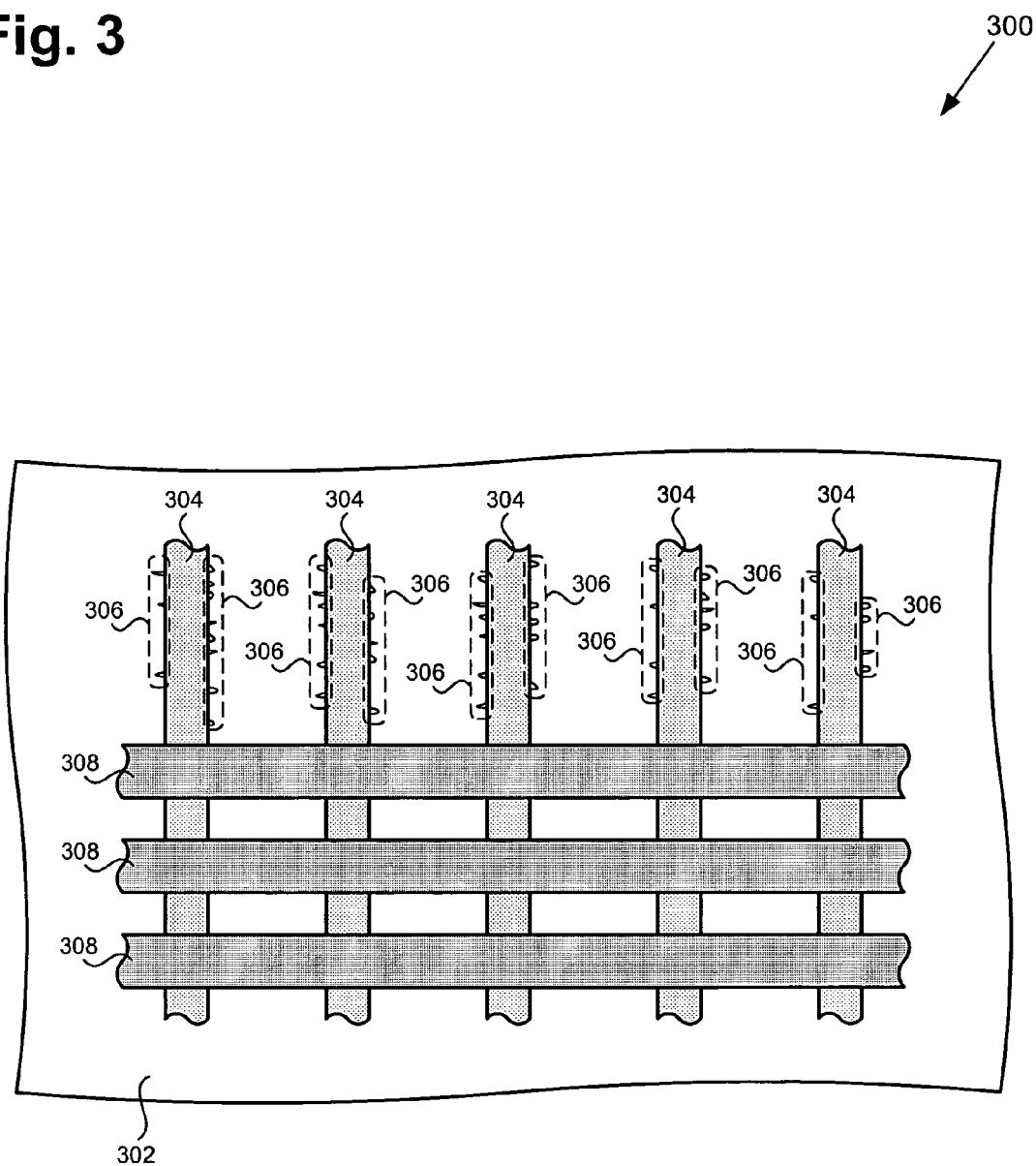
FIG. 3 illustrates a top view of a structure including exemplary polysilicon nodules defects that are formed on exemplary oxide segments after an overlying exemplary polysilicon layer has been etched.

FIG. 3 shows a top view of an exemplary structure including exemplary polysilicon nodule defects formed on exemplary oxide segments situated over a substrate. Structure 300 includes substrate 302, oxide segments 304, which include polysilicon nodule defects 306, and polysilicon segments 308. Structure 300 can be, for example, an intermediate structure that results after performance of an etch process to form polysilicon segments during fabrication of a semiconductor memory device.

As shown in FIG. 3, oxide segments 304 are situated over substrate 302 and can comprise high density plasma (HDP) oxide or other suitable oxide material. Each one of oxide segments 304 can also be situated over a bitline (not shown in FIG. 3). Oxide segments 304 can be formed over substrate 302 by using a CVD process or other suitable deposition processes. Also shown in FIG. 3, polysilicon segments 308 are situated over and aligned perpendicular to oxide segments 304. Each of polysilicon segments 308 can comprise polysilicon and can be a wordline in a semiconductor memory device. Polysilicon segments 308 can be formed by depositing a layer of polysilicon over oxide segments 304 and appropriately etching the layer of polysilicon. As a result of the etch process utilized to form polysilicon segments 308, polysilicon nodule defects (e.g. polysilicon nodule defects 306) can be formed on oxide segments 304. Polysilicon nodules defects 306 can include polysilicon stringers and can be situated on the sidewalls of oxide segments 304.

The present invention provides a two-step polysilicon wet etch process for effectively removing substantially all of polysilicon nodule defects (e.g. polysilicon nodule defects 306) that can form on one or more oxide segments (e.g. oxide segments 304) after an overlying layer of polysilicon has been etched. The invention's polysilicon wet etch process comprises a first step that utilizes an isotropic wet etch chemistry that can include hydrofluoric acid (HF) and a second step that utilizes an isotropic wet etch chemistry that can include a mixture of ammonium hydroxide, hydrogen peroxide, and water, which is also referred to as "APM" at raised temperatures. In the first step of the invention's polysilicon wet etch process, the HF can be utilized to remove surface oxide that can form on polysilicon nodule defects 306 and that can prevent polysilicon nodule defects 306 from being etched. The HF can also be utilized to remove any unwanted residual material from prior processing steps. The wet etch chemistry utilized in the first step can be diluted solution comprising approximately 20.0 parts of water to 1.0 part of HF. The first step of the invention's polysilicon wet etch process can be performed for a duration of between 0.0 seconds and 20.0 seconds.

After any surface oxide has been removed from polysilicon nodule defects 306 in the first step of the process, the second step of the invention's polysilicon wet etch process is performed to remove substantially all of polysilicon nodule defects 306 from the sidewalls of oxide segments 304. The second step of the polysilicon wet etch process can be performed by using a mixture of ammonium hydroxide, hydrogen peroxide, and water (APM) in a respective ratio of between 1:2:5 and 1:4:20. In other words, APM in the second step can include a mixture of 1.0 part of ammonium hydroxide, between 2.0 parts and 4.0 parts of hydrogen peroxide, and between 5.0 parts and 20.0 parts of water. In one embodiment, the APM (ammonium hydroxide/hydrogen peroxide/water mixture) can have an approximate ratio of 1:4:20. The duration of the second step of the invention's polysilicon wet etch process can be between 35.0 minutes and 60.0 minutes. The APM temperature prior to mixing is maintained between 50° C. and 90° C.

The polysilicon removal rate for the second step of the polysilicon wet etch process can be between 25.0 Angstroms per minute and 50.0 Angstroms per minute, where the polysilicon removal rate refers to the amount of polysilicon that can be removed per minute by the APM from a blanket-deposited polysilicon layer situated on a test wafer, where the blanket-deposited polysilicon layer does not have polysilicon nodule defects. The polysilicon nodule defects (e.g. polysilicon nodule defects 306) can be substantially removed in a length of time that is required by the APM to remove (i.e. etch) between 20.0 Angstroms and 90.0 Angstroms of polysilicon from a blanket-deposited polysilicon layer situated on the test wafer, where the blanket-deposited polysilicon layer does not have polysilicon nodule defects. In one embodiment, polysilicon nodule defects having a maximum length of approximately 1000.0 Angstroms (as measured from the sidewalls of the oxide segments 304) can be removed in an equivalent length of time required by the APM to remove approximately 50.0 Angstroms of polysilicon from the test wafer.

Thus, as discussed above, the invention's two-step polysilicon wet etch process can effectively remove polysilicon nodule defects, such as polysilicon stringers, that form on one or more oxide segments after an overlying layer of polysilicon has been etched.

Figure 4:
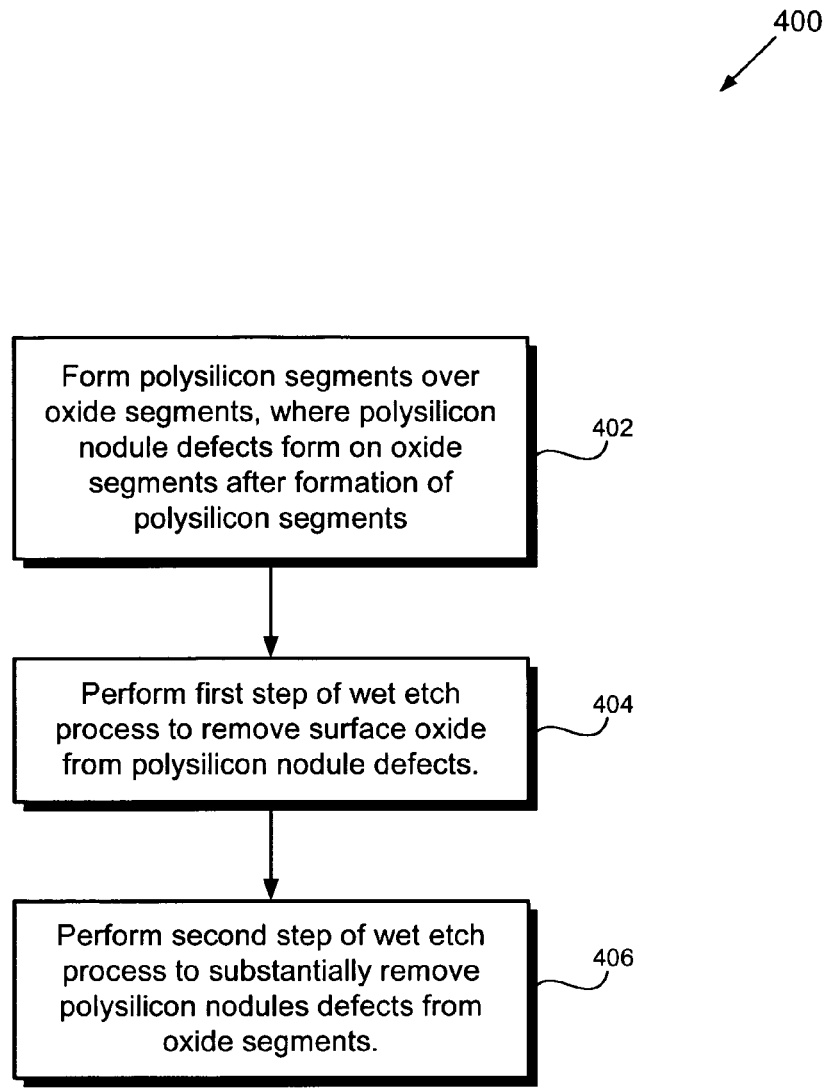
FIG. 4 shows a flowchart illustrating the steps taken to implement an embodiment of the present invention.

FIG. 4 shows a flowchart illustrating an exemplary method according to an embodiment of the present invention. Certain details and features have been left out of flowchart 400 that are apparent to a person of ordinary skill in the art. For example, a step may consist of one or more substeps or may involve specialized equipment or materials, as known in the art. Steps 402, 404, and 406 indicated in flowchart 400 are sufficient to describe one embodiment of the present invention; other embodiments of the invention may utilize steps different from those shown in flowchart 400.

Referring now to step 402 of flowchart 400 in FIG. 4, polysilicon segments 308 in FIG. 3 are formed over oxide segments 304, where polysilicon nodule defects 306 are formed on oxide segments 304 after formation of polysilicon segments 308. Polysilicon segments 308 are situated over and aligned perpendicular to oxide segments 304, can comprise polysilicon, and can form respective wordlines in a semiconductor memory device. Oxide segments 304 are situated over substrate 302 and can comprise HDP oxide or other suitable oxide material. Polysilicon segments 308 can be formed by depositing a layer of polysilicon over oxide segments 304 and appropriately etching the layer of polysilicon. As a result of the etch process, polysilicon nodule defects (e.g. polysilicon nodule defects 306) can be formed on the sidewalls of oxide segments 304.

At step 404 of flowchart 400, a first step of the invention's polysilicon wet etch process is performed to remove surface oxide from polysilicon nodule defects 306. In the first step of the polysilicon etch process, the surface oxide that forms on polysilicon nodule defects 306 can be removed by utilizing an isotropic wet etch chemistry comprising HF, which can be applied to the wafer for a duration of between 0.0 seconds and 20.0 seconds. At step 406 of flowchart 400, a second step of the polysilicon wet etch process can be performed to substantially remove polysilicon nodule defects 306 from oxide segments 304. The second step of the polysilicon wet etch process can be performed by using a mixture of ammonium hydroxide, hydrogen peroxide, and water in a ratio including 1.0 part of ammonium hydroxide, between 2.0 and 4.0 parts of hydrogen peroxide, and between 5.0 and 20.0 parts of water. The duration of the second step of the invention's polysilicon wet etch process can be between 35.0 minutes and 60.0 minutes.

The polysilicon removal rate for the second step of the polysilicon wet etch process is equivalent to the removal of between 25.0 Angstroms per minute and 50.0 Angstroms per minute of polysilicon from a blanket layer of polysilicon situated on a test wafer using the APM (ammonium hydroxide/hydrogen peroxide/water mixture). The polysilicon nodule defects (e.g. polysilicon nodule defects 306) can be substantially removed in a length of time that is required by the APM to remove (i.e. etch) between 20.0 Angstroms and 90.0 Angstroms of polysilicon from the test wafer.

Thus, as discussed above, the invention provides a polysilicon CMP process for effectively removing polysilicon nodule defects from a layer of polysilicon, where the polysilicon nodule defects are formed during deposition of the polysilicon layer. The invention further provides a two-step polysilicon wet etch process for effectively removing polysilicon nodule defects that can form on one or more oxide segments after an overlying layer of polysilicon has been etched. The invention's two-step polysilicon wet etch process can also be generally utilized to effectively etch small thicknesses of polysilicon during semiconductor device fabrication.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a method for effectively removing polysilicon nodule defects has been described.

The invention claimed is:

1. A method comprising steps of:
   etching a polysilicon layer to form at least one polysilicon segment, said at least one polysilicon segment being situated over at least one oxide segment, polysilicon nodule defects being formed on sidewalls of said at least one oxide segment after said step of etching said polysilicon layer;
   performing a first step of a polysilicon wet etch process to remove surface oxide from said polysilicon nodule defects;
   performing a second step of said polysilicon wet etch process to substantially remove said polysilicon nodule defects from said at least one oxide segment.

2. The method of claim 1 wherein said second step of said polysilicon wet etch process includes a mixture comprising ammonium hydroxide, hydrogen peroxide, and water.

3. The method of claim 2 wherein said polysilicon nodule defects can be substantially removed by said second step of said polysilicon wet etch process in a length of time required by said mixture to remove between 20.0 Angstroms and 90.0 Angstroms of blanket-deposited polysilicon situated on a polysilicon nodule defect free test wafer.

4. The method of claim 2 wherein said mixture comprises 1.0 part of said ammonium hydroxide, between 2.0 parts and 4.0 parts of said hydrogen peroxide, and between 5.0 parts and 20.0 parts of said water.

5. The method of claim 4 wherein said second step of said polysilicon wet etch process is performed for a duration of between 35.0 minutes and 60.0 minutes.

6. The method of claim 1 wherein said first step of said polysilicon wet etch process includes hydrofluoric acid.

7. The method of claim 6 wherein said first step of said polysilicon wet etch process is performed for a duration of between 0.0 seconds and 20.0 seconds.

8. The method of claim 1 wherein said at least one oxide layer comprises high density plasma oxide.

9. The method of claim 8 wherein said at least one polysilicon segment comprises a wordline, wherein said wordline is aligned perpendicular to said at least one oxide layer.

10. The method of claim 2 wherein said mixture comprises 1.0 part of said ammonium hydroxide, 4.0 parts of said hydrogen peroxide, and 20.0 parts of said water.

* * * * *